(12) United States Patent
Kamada

(10) Patent No.: US 6,914,000 B2
(45) Date of Patent: Jul. 5, 2005

(54) POLISHING METHOD, POLISHING SYSTEM AND PROCESS-MANAGING SYSTEM

(75) Inventor: Hiroyuki Kamada, Muko (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 297 days.

(21) Appl. No.: 10/229,294

(22) Filed: Aug. 28, 2002

(65) Prior Publication Data

US 2003/0068889 A1 Apr. 10, 2003

(30) Foreign Application Priority Data

Sep. 4, 2001 (JP) ........................................ 2001-267215

(51) Int. Cl.[7] ............................................. H01L 21/302
(52) U.S. Cl. ...................... 438/692; 438/694; 438/695; 438/697; 438/698
(58) Field of Search ............................... 438/692, 694, 438/695, 697, 698

(56) References Cited

U.S. PATENT DOCUMENTS 6,113,462 A * 9/2000 Yang .............................. 451/5

FOREIGN PATENT DOCUMENTS

| EP | 1 066 925 A2 | 1/2000 | |
|---|---|---|---|
| EP | 1066925 A2 * | 1/2001 | ........... B24B/37/04 |
| JP | 2001-60572 | 3/2001 | |

* cited by examiner

Primary Examiner—Nadine G. Norton
Assistant Examiner—Binh X. Tran
(74) Attorney, Agent, or Firm—McDermott Will & Emery LLP

(57) ABSTRACT

A polishing method of the present invention is a polishing method for planarizing a film to be polished that is deposited on a wafer, and includes a step (a) of establishing a polishing rate distribution of the film to be polished that is deposited on the wafer and a target film thickness distribution after polishing of the film to be polished, a step (b) of measuring a film thickness distribution before polishing of the film to be polished, a step (c) of calculating a predicted film thickness distribution after polishing of the film to be polished from the film thickness distribution before polishing and the polishing rate distribution, a step (d) of calculating a pressure against a polishing pad for each of a plurality of regions of the film to be polished and a polishing time from the predicted film thickness distribution and the target film thickness distribution, and a step (e) of polishing while applying the pressure against the film to be polished during the polishing time.

6 Claims, 16 Drawing Sheets

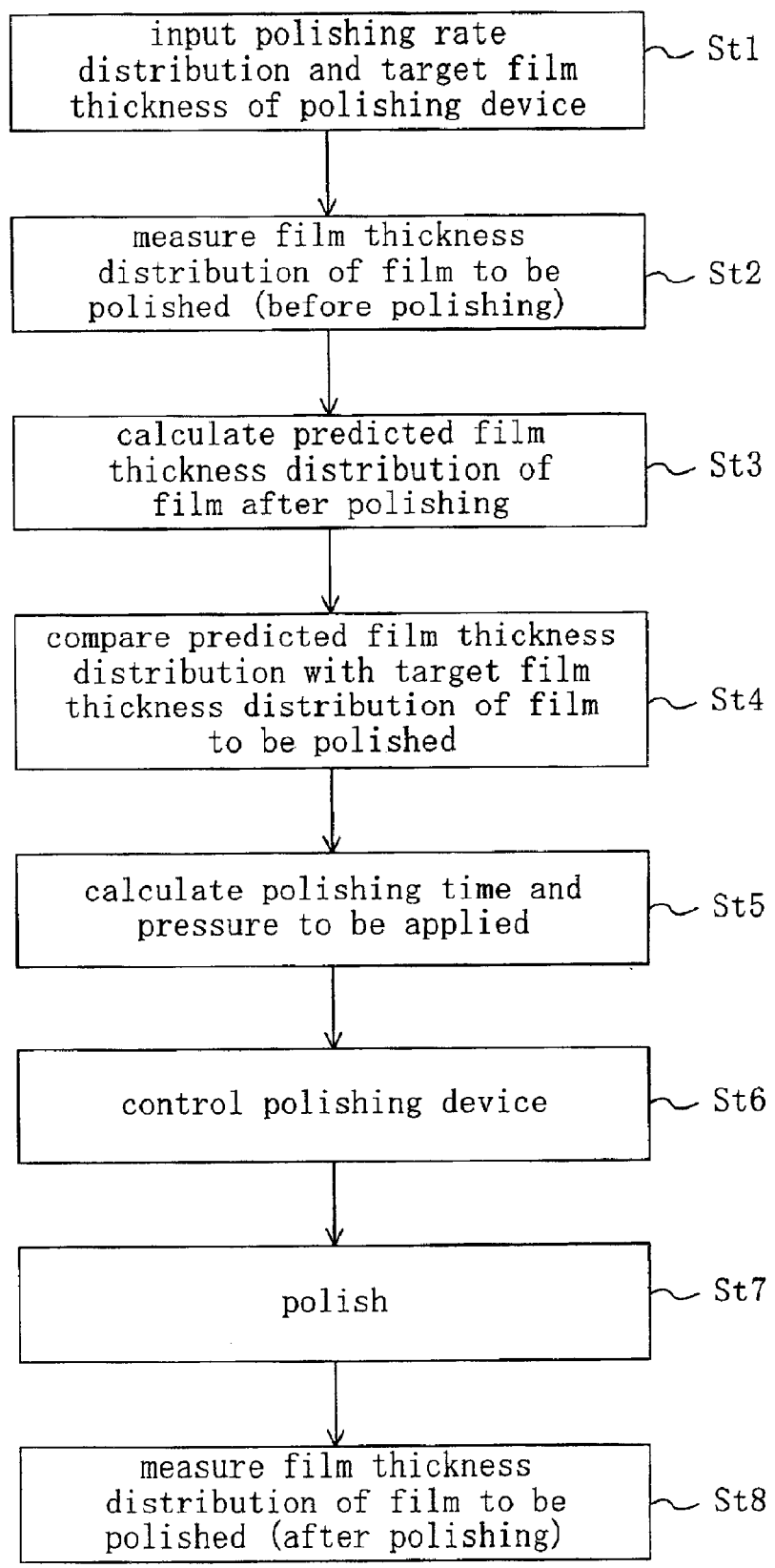

POLISHING METHOD, POLISHING SYSTEM AND PROCESS-MANAGING SYSTEM

BACKGROUND OF THE INVENTION

The present invention relates to polishing methods and polishing devices, and in particular relates to planarization during manufacturing processes for semiconductor devices.

Recent advances in the miniaturization of semiconductors have led to an increase in the number of process steps in semiconductor manufacturing processes and have made the processes more complex. As a result, problems caused by unevenness (steps) present in the surface of semiconductor devices (such as variation in resist dimensions when patterning with photolithography, and wiring shorts at step portions), which have conventionally not been of particular concern, are becoming noticeable. Thus, in recent semiconductor manufacturing processes, a high degree of planarization of the semiconductor device surface is imperative.

Chemical mechanical polishing (hereinafter abbreviated as CMP) is a widely employed polishing method for planarizing the surface of semiconductor devices during semiconductor processing. A conventional polishing method using CMP is described with reference to FIG. 8.

As shown in FIG. 8, a polishing device 200 using conventional CMP is provided with a polishing plate 109, a polishing pad 110 that is adhered to the polishing plate 109, a carrier head 112 for holding the wafer to be polished, and a slurry supply chute 113.

The polishing plate 109 is rotated about a rotational shaft A1. A wafer 111 is held by the carried head 112. The carrier head 112 is provided with a rotational shaft A2 and rotates about this rotational shaft, and pushes the wafer 111 against the polishing pad 110 with a prescribed force as the rotational shaft A2 is moved back and forth.

In this state, slurry 114 that is supplied onto the polishing pad 110 from the slurry supply chute 113 disseminates over the polishing pad 110 and seeps between the polishing pad 110 and the wafer 111. Thus, the wafer 111 is polished. In other words, favorable polishing is accomplished through the dual action of mechanical polishing due to relative motion between the polishing pad 110 and the wafer 111 and the chemical action of the slurry 114.

However, in conventional CMP processes, as polishing of the wafer 111 proceeds, friction occurs at the polishing pad 110 and the amount that the wafer 111 protrudes from the carrier head 112 is changed. Consequently, after a certain period of time, the polishing pad 110 must be replaced and the amount that the wafer 111 protrudes from the carrier head 112 must be adjusted. At that time, technicians are relied on to manually attach the polishing pad 110 to the polishing plate 109 and to assemble the carrier head 112. Thus, even if the pressure at which the carrier head 112 pushes the wafer 111 against the polishing pad 110 and the speed at which the polishing plate 109 and the carrier head 112 are rotated are set to identical conditions and polishing is performed, the distribution of the thickness polished in a set period (hereinafter, referred to as the polishing rate) on the polishing surface of the wafer 111 is changed, and this is not easily corrected.

A method of correcting and controlling the polishing rate is disclosed in JP 2001-60572A. According to this method, during polishing, the thickness of the film that is being polished on the wafer is monitored and compared to a target film thickness distribution, and by adjusting the pressure inside the chamber holding the wafer provided on the carrier head, a polished surface of a desired flatness is obtained.

This method can be used to solve the foregoing conventional problems, however, it also has the following drawbacks.

First, with this method, if the film thickness distribution that is obtained differs from the target, then the pressure within the chamber is altered during polishing so as to draw the film thickness distribution closer to the target. At this time, the equilibrium of the force due to the relative motion acting between the polishing pad and the wafer is upset, and irregular polishing (such as a polishing rate locally above predicted values) occurs as a consequence. In the worst cases, there is a risk that the wafer may break or be detached from the carrier head, for example.

Also, during the CMP process, environmental factors such as changes in temperature during polishing may cause the polishing rate to change. Consequently, environmental parameters being changed by altering the pressure within the chamber during polishing, as in the above method, results in an increase in the number of unstable factors when polishing.

Moreover, according to this method, measurement during polishing of the film thickness of the film that is polished is achieved by measuring the intensity of the light that is reflected from numerous sampling zones on the wafer and converting this measured intensity into the film thickness. With this method of measurement, because the wafer is rotated during polishing, it is not possible to control at what parts of an actual wafer that is provided with patterns the light beam emanated from the light source is irradiated. For example, assuming a step for polishing an interlayer insulating film during a wiring step, the measured value of the film thickness of the interlayer insulating film will differ by an amount corresponding to the thickness of the wiring depending on whether the light beam is irradiated onto the interlayer insulating film deposited on the wiring or is irradiated onto the interlayer insulating film that is deposited on a region where the wiring is not formed. That is, the measured value will always include an error corresponding to the amount of wiring thickness. Thus, the above method is not suitable when precise film thickness control is required.

SUMMARY OF THE INVENTION

The present invention was arrived at in order to solve the foregoing drawbacks, and its object is to provide a polishing method, a polishing system, and a process-managing system capable of a high degree of planarization of a film to be polished that is deposited on a wafer.

A polishing method of the present invention is a polishing method for planarizing a film to be polished that is deposited on a wafer, and includes a step (a) of establishing a polishing rate distribution of the film to be polished that is deposited on the wafer and a target film thickness distribution after polishing of the film to be polished, a step (b) of measuring a film thickness distribution before polishing of the film to be polished, a step (c) of calculating a predicted film thickness distribution after polishing of the film to be polished from the film thickness distribution before polishing and the polishing rate distribution, a step (d) of calculating a pressure against a polishing pad for each of a plurality of regions of the film to be polished and a polishing time from the predicted film thickness distribution and the target film thickness distribution, and a step (e) of polishing while applying the pressure against the film to be polished during the polishing time.

According to this polishing method of the present invention, the predicted film thickness distribution and the target film thickness distribution are compared so that, before polishing of the film to be polished, the polishing time and the pressure against the polishing pad at each of the plurality of regions of the film to be polished are controlled. That is, pressure against the polishing pad at each of the plurality of regions of the film to be polished is not changed during polishing. Consequently, the equilibrium of the force acting between the polishing pad and the wafer to be polished is not upset during polishing. In addition, because the pressure against the polishing pad at each of the plurality of regions of the film to be polished is not changed during polishing, stable polishing is possible.

It is preferable that the polishing method further includes a step (f), carried out after the step (e), of measuring the film thickness distribution after polishing the film and updating the polishing rate distribution based on the film thickness distribution after polishing and the film thickness distribution before polishing, and that the steps (a) to (f) are repeated.

Thus, in the second and subsequent routines of steps (a) to (f), the polishing rate distribution that is established is updated with a new polishing rate. Consequently, in each routine, an accurate predicted film thickness distribution is always yielded, and the pressure against the polishing pad at each of the plurality of regions of the film to be polished and the polishing time that are calculated based on the predicted film thickness distribution can also be accurately obtained. Thus, numerous wafers in which the polished film has the target film thickness distribution can be obtained.

It is preferable that a test wafer is used when the step (a) is carried out for a first time.

Thus, the initial polishing rate distribution that is established in the first step (a) can be updated. Accordingly, in wafers to be polished in the second routine or thereafter, the target film thickness distribution of the film to be polished can be obtained with high accuracy. In addition, a wafer actually used on which patterns such as wiring have been formed is not wasted in the first routine.

It is preferable that the film to be polished has a top layer film located at an uppermost portion and a bottom layer film formed below the top layer film, and that in the step (a), a polishing rate distribution of the top layer film and a target film thickness distribution after polishing of the film to be polished are established, that in the step (b), the film thickness distribution before polishing of the top layer film and the bottom layer film are measured, and that in the step (c), the predicted film thickness distribution after polishing of the film to be polished is calculated from a film thickness distribution before polishing of the film to be polished, which has been converted based on a polishing rate ratio of the bottom layer film to the top layer film, and the polishing rate distribution of the top layer film.

Thus, the film to be polished is a stacked film, and if the bottom layer film is also polished, then the film thickness distribution after polishing the film can be predicted with even greater accuracy. Accordingly, the target film thickness distribution for the film to be polished can be attained with high accuracy. That is, a high degree of planarization of the surface of the wafer is possible.

It is preferable that the film to be polished has a top layer film located at an uppermost portion and a bottom layer film formed below the top layer film, and that in the step (a), a polishing rate distribution of the top layer film and a target film thickness distribution after polishing the film are established, that in the step (b), the film thickness distribution before polishing of the top layer film and the bottom layer film are measured, and that in the step (c), the predicted film thickness distribution after polishing of the polished film is calculated from the polishing rate distribution of the top layer film and the film thickness distribution before polishing of the film to be polished, which is obtained from the film thickness distribution before polishing of the top layer film and the bottom layer film.

Thus, the film to be polished is a stacked film, and if the bottom layer film is not polished, then the film thickness distribution after polishing of the polished film can be predicted with even greater accuracy. Accordingly, the target film thickness distribution for the film to be polished can be attained with high accuracy. That is, a high degree of planarization of the surface of the wafer is possible.

A polishing system of the present invention is provided with a polishing means having a carrier head for holding a wafer and a polishing pad in opposition to the carrier head, a pressure applying means for applying pressure against the polishing pad independently for each of a plurality of regions of a film to be polished that is deposited on the wafer, a storage means for storing a polishing rate distribution of the film to be polished that is in the polishing means and a target film thickness distribution after polishing the film, and a control means for calculating a predicted film thickness distribution after polishing of the film to be polished from the film thickness distribution before polishing of the film to be polished and the polishing rate distribution of the film to be polished, and controlling the pressure applying means and the polishing means so as to polish at the polishing time and the pressure against the polishing pad that is applied to each of the plurality of regions of the film to be polished, which are calculated from the predicted film thickness distribution and the target film thickness distribution.

According to this polishing system of the present invention, polishing is performed at the polishing time and the pressure against the polishing pad that is applied at each of the plurality of regions of the film to be polished, which are calculated from the predicted film thickness distribution and the target film thickness distribution. That is, pressure against the polishing pad at each of the plurality of regions of the film to be polished is not changed during polishing. Consequently, the equilibrium of the force due to the relative motion acting between the polishing pad and the wafer to be polished is not upset during polishing. In addition, because the pressure against the polishing pad at each of the plurality of regions of the film to be polished is not changed during polishing, stable polishing is possible.

It is preferable that the control means controls the film thickness measuring means so that it measures the film thickness distribution before polishing and the film thickness distribution after polishing of the film to be polished, and updates the polishing rate distribution of the film to be polished based on the film thickness distribution before polishing, the film thickness distribution after polishing, and the polishing time.

Thus, if numerous wafers are polished, then the polishing rate distribution that is obtained through polishing of the film to be polished of the wafer immediately prior is utilized, so that an accurate predicted film thickness distribution is always yielded for each wafer, and the pressure against the polishing pad at each of the plurality of regions of the film to be polished and the polishing time that are calculated based on the predicted film thickness distribution can also be accurately estimated. Thus, numerous wafers in which the film deposited thereon has the target film thickness distribution can be obtained.

The pressure applying means can be provided in the carrier head and apply pressure against a surface in opposition a primary surface of the wafer.

It is also possible for the carrier head to include a retainer ring, a wafer holding seal, a plurality of apertures provided in its bottom surface, and ducts connected to the plurality of apertures, and for the polishing system to further comprise mass flow controllers each connected to one of the ducts.

The plurality of apertures can be provided in a plurality of concentric circles on the bottom surface of the wafer holding seal.

The polishing means can further include a plate on the surface of which the polishing pad is provided.

It is also possible that the polishing means further includes a ring-shaped belt on the surface of which the polishing pad is provided, that the pressure applying means is furnished with an air platen provided in opposition to the carrier head and sandwiching the belt therebetween, and that the air platen is furnished with a plurality of apertures provided in its surface that opposes the carrier head, ducts connected to the plurality of apertures, and mass flow controllers each connected to one of the ducts.

Further, if the film to be polished has a top layer film positioned on an uppermost portion and a bottom layer film formed below the top layer film, then the control means stores to the storage means the polishing rate distribution of the top layer film in the polishing means, and calculates the predicted film thickness distribution after polishing of the polished film from the film thickness distribution before polishing of the film to be polished, which is converted based on the polishing rate ratio of the bottom layer film to the top layer film, and the polishing rate distribution of the top layer film.

Thus, if the bottom layer film of the film to be polished is also polished, then the film thickness distribution after polishing of the polished film can be predicted with even greater accuracy. Accordingly, the target film thickness distribution for the film to be polished can be attained with high accuracy. That is, a high degree of planarization of the surface of the wafer is possible.

Further, if the film to be polished has a top layer film positioned on an uppermost portion and a bottom layer film formed below the top layer film, then the control means stores to the storage means the polishing rate distribution of the top layer film in the polishing means, and calculates the predicted film thickness distribution after polishing of the film to be polished from the film thickness distribution before polishing of the film to be polished, which is obtained from the film thickness distribution before polishing of the top layer film and the bottom layer film, and the polishing rate distribution of the top layer film.

Thus, if the bottom layer film of the film to be polished is not polished, then the film thickness distribution after polishing of the film to be polished can be predicted with even greater accuracy. Accordingly, the target film thickness distribution for the film to be polished can be attained with high accuracy. That is, a high degree of planarization of the surface of the wafer is possible.

A process-managing system of the present embodiment includes a polishing device having a carrier head for holding a wafer and a polishing pad in opposition to the carrier head, a pressure applying means for applying pressure against the polishing pad independently for each of a plurality of regions of a film to be polished that is deposited on the wafer, a film thickness measuring means for measuring the thickness of the film to be polished, a storage means for storing a polishing rate distribution of the film to be polished, which is in the polishing means, and a target film thickness distribution after polishing the film, and a control means for calculating a predicted film thickness distribution after polishing the film from the film thickness distribution before polishing of the film to be polished and the polishing rate distribution of the film to be polished, controlling the pressure applying means and the polishing means so as to polish at the polishing time and the pressure applied to each of the plurality of regions of the film to be polished, which are calculated from the predicted film thickness distribution and the target film thickness distribution, measuring the film thickness distribution after polishing of the polished film, and updating the polishing rate distribution of the film to be polished based on the film thickness distribution before polishing, the film thickness distribution after polishing, and the polishing time.

According to the process-managing system of the present invention, polishing is performed at the polishing time and the pressure applied to each of the plurality of regions of the film to be polished, which are calculated from the predicted film thickness distribution and the target film thickness distribution. That is, pressure against the polishing pad at each of the plurality of regions of the film to be polished is not changed during polishing. Consequently, the equilibrium of the force due to the relative motion acting between the polishing pad and the wafer to be polished is not upset during polishing. In addition, because the pressure against the polishing pad at each of the plurality of regions of the film to be polished is not changed during polishing, stable polishing is possible.

Further, according to the process-managing system of the present invention, the film thickness distribution of the film to be polished is not measured during polishing. Thus, the film thickness of the film to be polished does not have to be measured while the wafer is revolving. Accordingly, the film thickness of predetermined measurement regions can be measured accurately, and as a result, error included in the film thickness distribution that is measured is extremely small, and precise film thickness control can be performed.

Also, if numerous wafers are to be polished, then the polishing rate distribution of the film to be polished that is obtained through polishing the wafer immediately prior is utilized, so that an accurate predicted film thickness distribution is always yielded for each wafer, and the pressure against the polishing pad at each of the plurality of regions of the film to be polished and the polishing time that are calculated based on the predicted film thickness distribution can also be accurately estimated. Thus, numerous wafers in which the polished film has the target film thickness distribution can be obtained.

BRIEF DESCRIPTION OF THE DRAWINGS

FIG. 3 is a flowchart showing the polishing method of Embodiment 1.

DETAILED DESCRIPTION OF THE INVENTION

Hereinafter, embodiments of the present invention are described with reference to the drawings.

Embodiment 1

Figure 1:
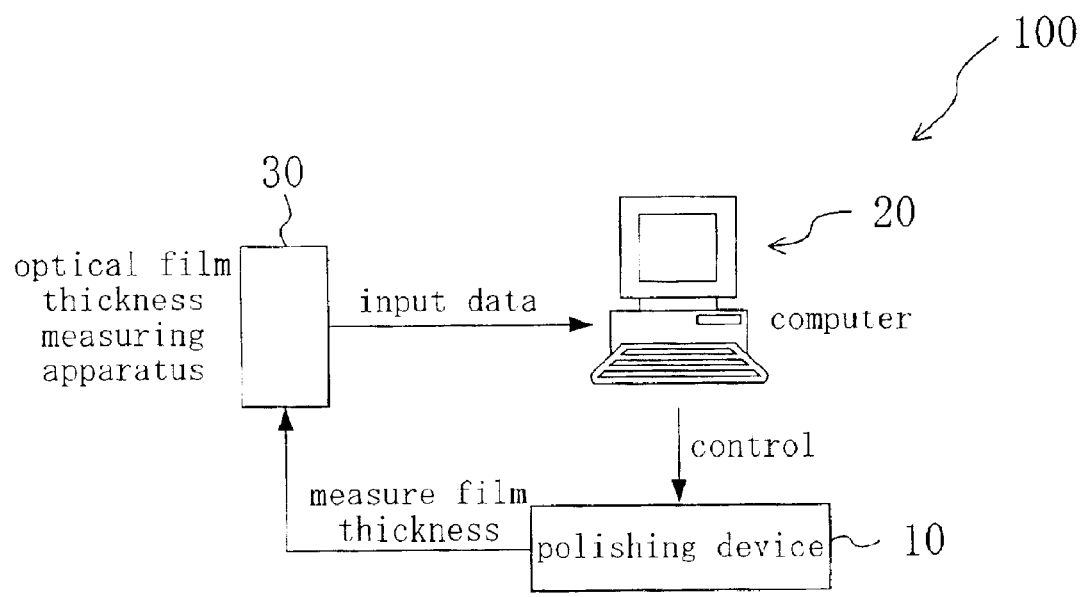
FIG. 1 is a schematic view illustrating the polishing system of Embodiment 1.
Figure 2A:
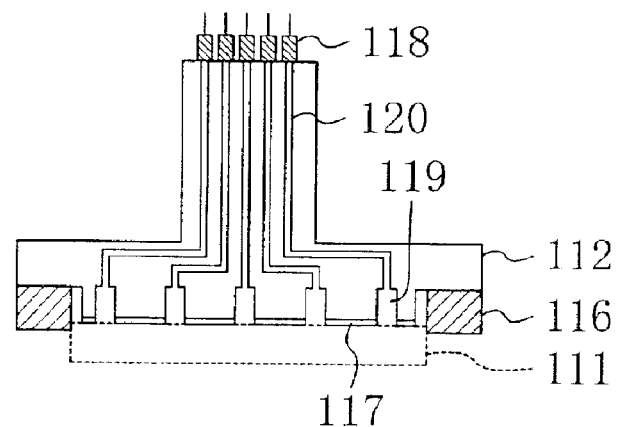
FIG. 2A is a cross-sectional view of the carrier head used in Embodiment 1.
Figure 2B:
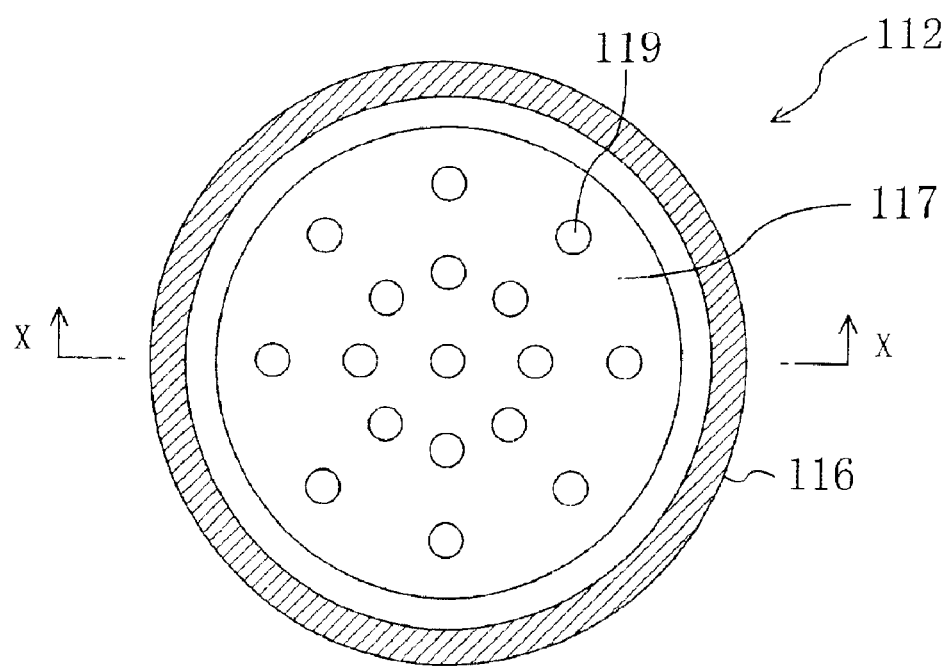
FIG. 2B is a diagram showing the bottom surface of the carrier head shown in FIG. 2A.

FIG. 1 schematically shows a polishing system 100 of this embodiment. FIG. 2A is a cross-sectional view of the carrier head that is employed in this embodiment, and FIG. 2B shows the bottom surface of the carrier head shown in FIG. 2A. It should be noted that FIG. 2A is a cross-sectional view taken along the X—X line shown in FIG. 2B.

As shown in FIG. 1, the polishing system 100 of this embodiment is provided with a polishing device 10, a computer 20 for controlling the polishing device 10, and an optical film thickness measuring apparatus 30.

The polishing device 10 has substantially the same configuration as the conventional polishing device 200, except that the carrier head 112 of the polishing device 10 of this embodiment is configured differently than that of the conventional example.

As shown in FIGS. 2A and 2B, the carrier head 112 is provided with a retainer ring 116, a wafer holding seal 117, a plurality of apertures provided in the bottom surface of the carrier head 112 spreading out in concentric circles, and ducts 120 each connected to an aperture 119. Each duct 120 is connected to a mass flow controller 118, thereby creating a system through which air or gas such as nitrogen gas is blown onto the wafer 111 via the ducts 120. Thus, with the carrier head 112, the pressure that is applied to the rear surface of the wafer 111 can be controlled independently by adjusting the gas flow through each mass flow controller 118. The carrier head that is disclosed in JP 2001-54853A can also be used.

The computer 20 controls the polishing device 10 based on data on the film thickness distribution that are input from the optical film thickness measuring apparatus 30. It should be noted that the initial data on the polishing rate distribution for the film to be polished and the initial data on the target film thickness distribution of the film to be polished are included in the polishing device 10 and are input to the computer 20 in advance as data for system management, which is performed after system maintenance and after the system is started. The computer 20 is programmed so that when the film thickness is input from the optical film thickness measuring apparatus 30, it calculates the polishing time and the expected film thickness distribution after polishing of the polished film based on the polishing rate distribution of the film to be polished that is input in advance, and compares this to the target film thickness distribution of the film to be polished.

The optical film thickness measuring apparatus 30 measures the film thickness distribution of the film to be polished that is deposited on the wafer 111, and inputs the results of this measurement to the computer 20.

Figure 4:
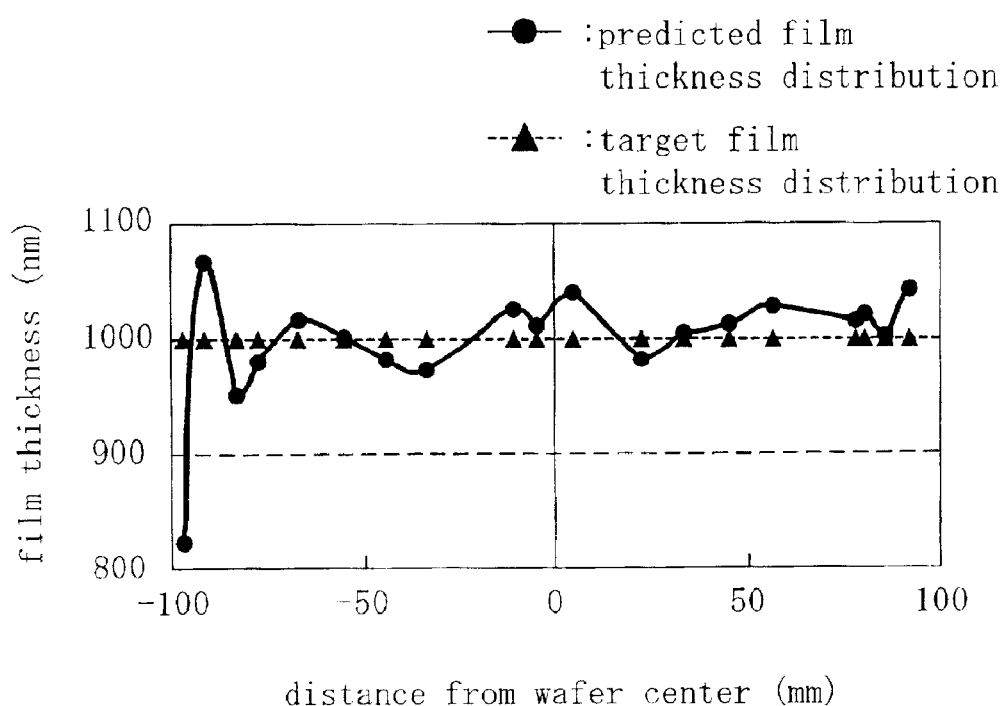
FIG. 4 is a diagram showing a comparison of the predicted film thickness distribution and the target film thickness distribution after polishing the film.

Next, the polishing method using the polishing system of this embodiment is described with reference to FIGS. 1 to 4. FIG. 3 is a flow chart illustrating the polishing method of this embodiment. FIG. 4 shows a comparison between the predicted film thickness distribution and the target film thickness distribution after polishing of the polished film.

First, in step St1 of FIG. 3, the polishing rate distribution and the target film thickness distribution of the film to be polished in the polishing device 10 are set in the computer 20. As mentioned above, the initial data on the polishing rate distribution of the film to be polished and the initial data on the target film thickness distribution of the film to be polished are set in the computer 20 in advance as data for system management, which is executed after system maintenance and after the system is started.

Next, in step St2, the film thickness distribution of the film to be polished that is deposited on the wafer 111 is measured using the optical film thickness measuring apparatus 30 and the results of this measurement are input into the computer 20, after which the wafer 111 is held by the carrier head 112.

Then, in step St3, the computer 20 calculates the predicted film thickness distribution after polishing of the polished film from the measured film thickness distribution of the film to be polished and the polishing rate distribution.

Next, in step St4, the computer 20 compares the predicted film thickness distribution with the target film thickness distribution after polishing of the polished film. As an example, results such as those shown in FIG. 4 are obtained.

Next, in step St5, in order to achieve the target film thickness distribution of the film to be polished, the computer 20 calculates the optimal polishing time and the optimal pressure values with respect to each region of the wafer 111 based on the results of the comparison made in step St4.

Next, in step St6, the computer 20 controls each mass flow controller 118 that is provided in the carrier head 112 of the polishing device 10 so as to achieve the amount of gas flow that corresponds to the pressure value that was calculated in step St5. For example, if results such as those shown in FIG. 4 are obtained in step St4, then it is clear that the predicted film thickness distribution after polishing of the polished film is thicker than the target film thickness distribution at the center portion and the periphery portion of the of the wafer 111. Thus, the gas flow of the mass flow controllers 118 located at the center portion and the periphery portion of the wafer 111 is increased and controlled so that the polishing rate at the center portion and the periphery portion of the wafer 111 rises. Next, in step St7, the polishing device 10 executes polishing of the wafer 111 at the optimal conditions (polishing time, pressure values for each region of the wafer) calculated in step St5.

Next, in step St8, the film thickness distribution of the film to be polished is measured by the optical film thickness measuring apparatus 30, and the results of this measurement are in put to the computer 20. The results of this measurement are entered into the computer 20, and the computer 20 calculates a new polishing rate distribution for the polishing device based on the difference between the measured results and the film thickness distribution before polishing of the oxide film.

The procedure then returns to step St1, and the computer 20 updates the established polishing rate distribution with the new polishing rate distribution.

By repeating the above steps St1 to St8, numerous wafers in which the polished film has the target film thickness distribution can be obtained.

In this embodiment, particular attention was given to the fact that the predicted film thickness distribution after polishing of the film to be polished can be obtained from the film thickness distribution before polishing of the film to be polished and the polishing rate distribution of the polishing device.

Accordingly, in this embodiment, the predicted film thickness distribution and the target film thickness distribution are compared so that the polishing time and the pressure that is applied to each specific region of the wafer 111 can be controlled before the film to be polished of the wafer 111 is polished. That is, the pressure at which the wafer 111 is pressed against specific regions of the polishing pad 110 is not changed during polishing. Thus, conventional drawbacks caused by an upset in the equilibrium of the force due to the relative motion acting between the polishing pad 110 and the wafer 111, such as irregular polishing, wafer breakage, and wafer detachment from the carrier head, do not occur. Also, environmental parameters are not changed by altering, for example, the pressure during polishing, and thus the CMP process can be stabilized.

Moreover, in this embodiment, the wafer 111 is polished in step St7 and the film thickness is measured in steps St2 and St8. That is, the film thickness is not measured during polishing. Thus, the wafer 111 is not moving when its film thickness is measured, so that it can also be controlled where the light beam radiated from the light source of the optical film thickness measuring apparatus 30 is irradiated on a wafer on which a pattern has been formed. As a result, error included in the measured value can be significantly reduced, and thus the method of the present invention is particularly well suited for a case where precise film thickness control is required.

It should be noted that the wafer 111 that is polished in the first routine of steps St1 to St8 after the polishing system is started is preferably a mirror wafer (test wafer) on which no pattern such as wiring has been formed and that has a film to be polished that is identical to that of the wafer on which a pattern such as wiring has been formed that will actually be used.

This allows the initial data on the polishing rate distribution that is set in the polishing system to be updated in the first routine of steps St1 to St8. Consequently, the target film thickness distribution can be accurately obtained for wafers 111 that are polished in the second and subsequent routines. Also, a wafer that will actually be used, on which a pattern such as wiring has been formed, is not wasted in the first routine.

In this embodiment, a method was adopted in which the film thickness distribution that is obtained by the optical film thickness measuring apparatus 30 is input to the computer 20, and it is preferable that the optical film thickness measuring apparatus 30 and the computer 20 are connected over a network and that in steps St2 and St8, the results of the measurement of the film thickness are automatically transferred to the computer 20. With this configuration, the task of inputting these results can be obviated, so that input errors and other human mistakes, for example, can be prevented.

Figure 5:
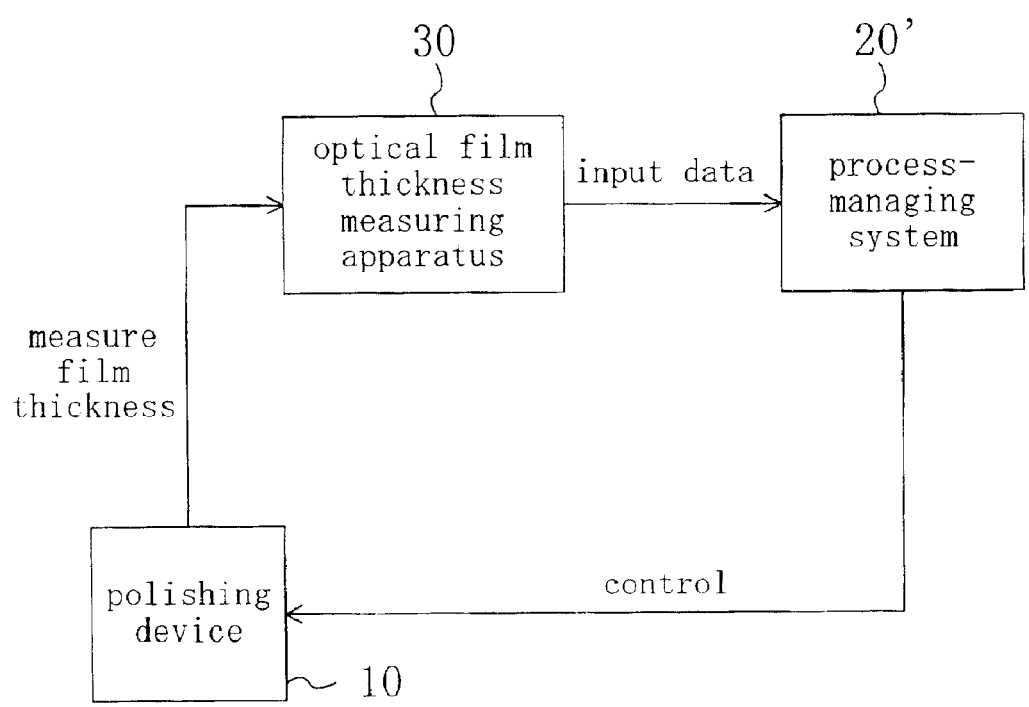
FIG. 5 is a schematic view illustrating the process-managing system of Embodiment 1.

Also, as shown in FIG. 5, a function completely equivalent to that of the computer 20 can be incorporated into a process-managing system (such as a CIM) 20' for managing the production line. More specifically, the process-managing system 20' can be connected to the polishing device 10 and the optical film thickness measuring apparatus 30, and a program for executing a function completely equivalent to that of the computer 20 can be added to the operating program of the process-managing system 20'.

Consequently, a new computer 20 for managing the polishing process does not have to be prepared, and thus costs incurred in establishing the polishing system can be reduced.

Embodiment 2

Figure 6:
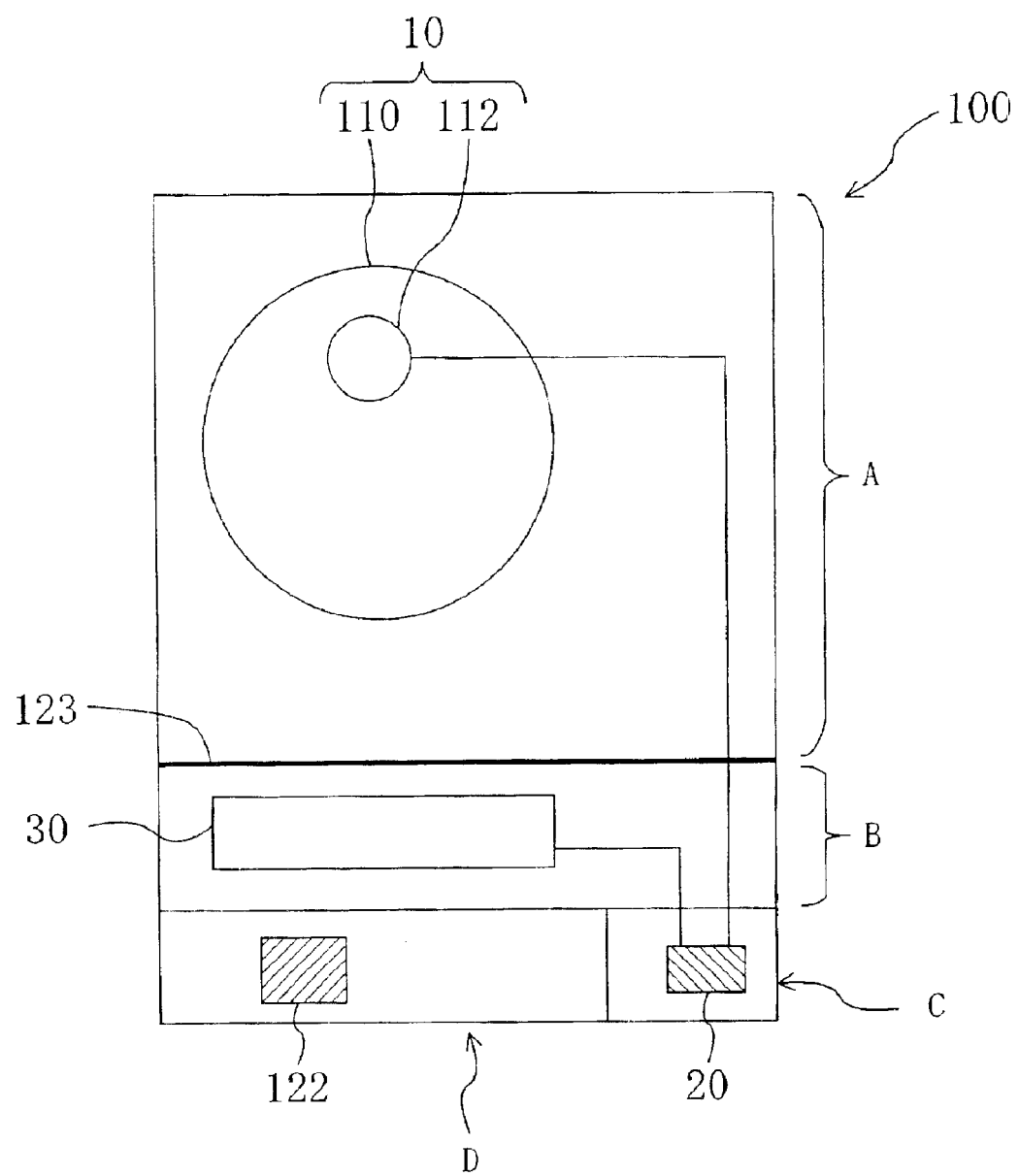
FIG. 6 is a diagram showing a specific example of the configuration of the polishing system of Embodiment 1.

In this embodiment, a specific example of the configuration of the polishing system 100 of Embodiment 1 is described with reference to FIG. 6.

The polishing system 100 includes a polishing block A, in which the polishing device 10 has been provided, a measuring block B for measuring the film thickness of the film to be polished on the wafer that is polished by the polishing device 10, a control block C for controlling the polishing device 10, and a holding block D for holding wafers that need to be polished. The polishing block A is separated from the other three blocks by a wall 123 made of a transparent plastic.

The polishing device 10 that is provided in the polishing block A is the polishing device that was described in Embodiment 1.

The optical film thickness measuring apparatus 30 for measuring the film thickness of the film to be polished on the wafer that is polished by the polishing device 10 is provided in the measuring block B. The optical film thickness measuring apparatus 30 is the optical film thickness measuring apparatus that was described in Embodiment 1. It should be noted that the optical film thickness measuring apparatus 30 is provided on a vibration proof stand so that the effects of vibration during polishing are prevented.

The computer 20 for controlling the polishing device 10 is provided in the control block C. The computer 20 is the computer that was described in Embodiment 1.

A wafer cassette 122 in which numerous wafers that need to be polished are stored is provided in the holding block D.

The operation of the polishing system 100 of this embodiment is described next.

First, a wafer is removed from the wafer cassette 122 and its thickness at predetermined regions is measured by the optical film thickness measuring apparatus 30. Then, the wafer is held with the carrier head 112 and moved onto the polishing pad 110.

During this time, the film thickness distribution before polishing of the film to be polished that is formed on the wafer, which is obtained through the above film thickness measurement, is stored in a memory in the computer 20. A processor inside the computer 20 then immediately executes the tasks of computing the predicted film thickness after polishing of the film to be polished from the film thickness distribution before polishing of the film to be polished and the polishing rate distribution of the polishing device 10, comparing the predicted film thickness distribution with the film thickness distribution of the film to be polished that is taken as the target (the target film thickness distribution), and calculating the polishing time and the pressure against the specific regions of the wafer from the results of this comparison.

Next, the computer 20 controls the mass flow controllers 118 of the carrier head 112 so that the amount of gas flow corresponds to the calculated pressure values, and then the wafer is polished by the polishing device 10.

After the wafer is polished, the thickness at predetermined regions of the film to be polished is once again measured by the optical film thickness measuring apparatus 30. The film thickness after polishing of the polished film that is obtained through this measurement is stored in a memory inside the computer 29, and a process in the computer 20 immediately calculates the polishing rate distribution of the polishing device 10 from the difference between the film thickness distribution before polishing and the film thickness distribution after polishing of the film to be polished, and the results of this calculation are stored in a memory.

It should be noted that in order to accurately learn the polishing rate of the polishing device, the film thickness at predetermined regions of the wafer must be measured. Accordingly, it is preferable that the optical film thickness measuring apparatus 30 is provided with an alignment function.

Also, although a washing process after polishing was not indicated in this embodiment, a washing device can be provided in the polishing block A and a washing process can be performed after polishing.

Embodiment 3

In Embodiments 1 and 2, the polishing device 10 is given a configuration in which the carrier head shown in FIGS. 2A and 2B is employed to independently control, at each specific region, the force at which the wafer 111 is pressed against the polishing pad 110, but as long as the polishing device 10 has a configuration where a changeable pressure can be independently applied to a plurality of regions on the wafer 111, it can be configured differently and still achieve a similarly high degree of planarization. In this embodiment, one example of a modified polishing device is described with reference to FIG. 1.

Figure 7A:
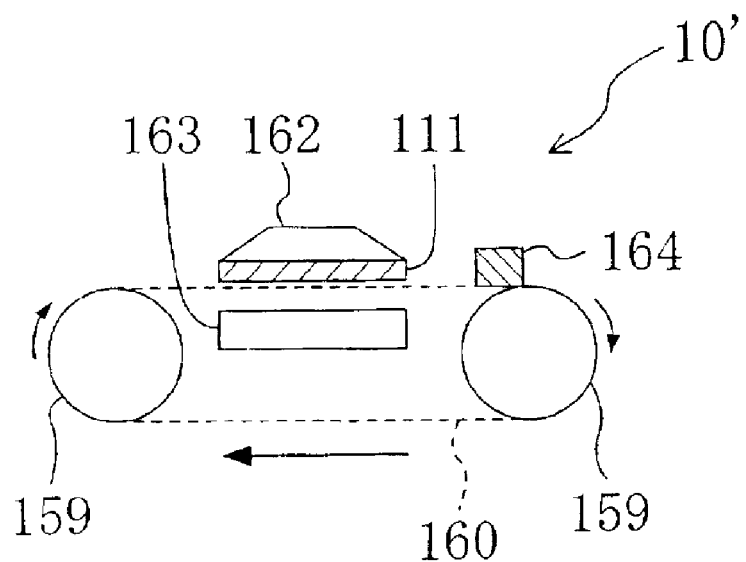
FIG. 7A is a lateral view of the polishing device of Embodiment 3.
Figure 7B:
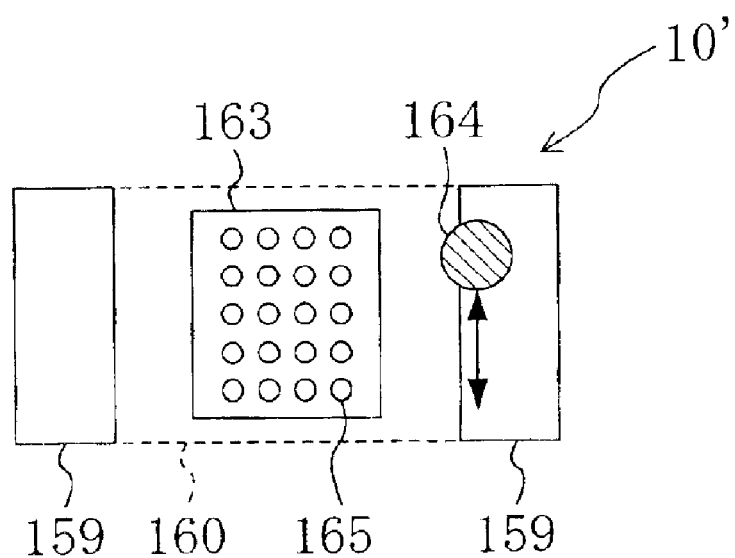
FIG. 7B is a top view of the polishing device of Embodiment 3.
Figure 8:
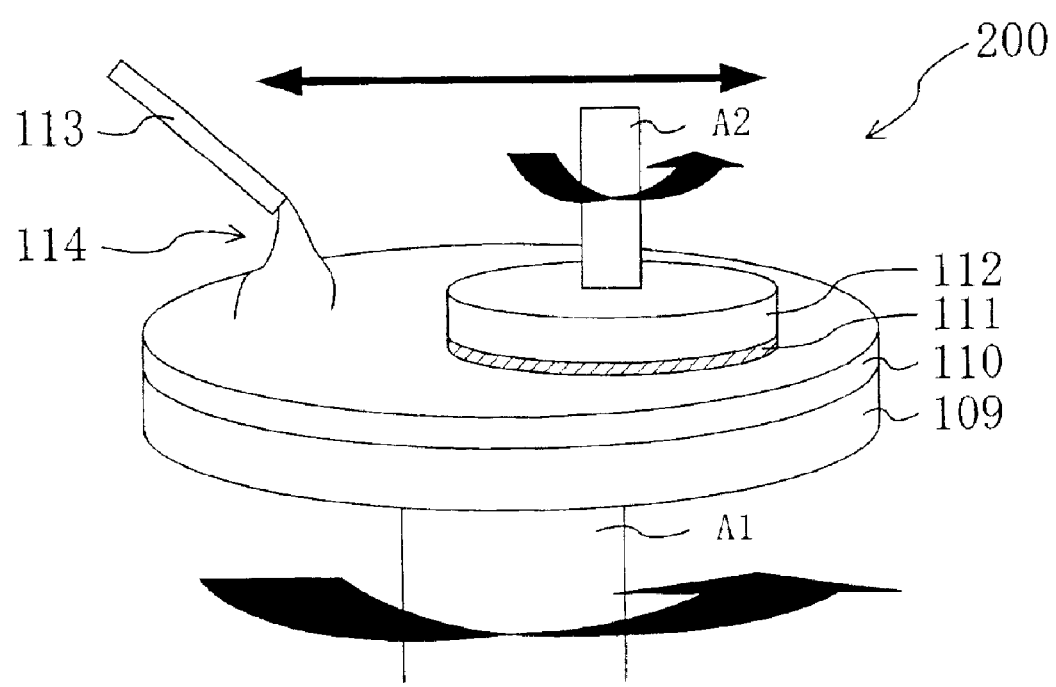
FIG. 8 is a diagram showing the polishing device.

FIG. 7A is a lateral view of the polishing device of this embodiment, and FIG. 7B is a top view of the polishing device of this embodiment.

As shown in FIGS. 7A and 7B, a polishing device 10' of this embodiment is provided with two rollers 159, a polishing belt 160 wound around the two rollers, a carrier head 162, an air platen 163 provided in opposition to the carrier head 162 and sandwiching the polishing belt 160 between it and the carrier head 162, a conditioner 164 for activating the polishing pad (not shown) that is provided on the surface of the polishing belt 160 to a state that is optimal for polishing, and a slurry supply chute (not shown).

The two rollers 159 rotate in the same direction at the same speed and drive the polishing belt 160. A polishing pad like the polishing plate 109 provided in the conventional polishing device 200 is attached to the polishing belt 160. The wafer 111 is held by the carrier head 162. The carrier head 162 is provided with a rotational shaft (not shown), and while rotating about its rotational shaft it presses the wafer 111 against the polishing pad with a specific pressure.

On the other hand, as shown in FIGS. 7A and 7B, the air platen 163 is provided with a plurality of apertures 165 in the side opposing the carrier head. Each aperture 165 is provided with a duct (not shown) and a mass flow controller (not shown) that is connected to the duct, and air or gas such as nitrogen gas is blown onto the polishing belt 160 through the ducts. With this configuration, the air platen 163 can adjust the amount of gas flowing thorough each mass flow controller, and thus the pressure that is applied to the surface of the wafer 111 from the polishing belt 160 can be independently controlled.

Embodiment 4

In this embodiment, another polishing method using the polishing system mentioned in Embodiment 1 is described.

In the polishing method described in Embodiment 1, the predicted film thickness distribution after the film is polished is calculated from the measured film thickness distribution of the film to be polished and the polishing rate distribution.

On the other hand, in this embodiment, a polishing method is described with reference to the drawings in which, if the film to be polished is a stacked film having two or more layers, the predicted film thickness distribution after the film is polished is calculated taking into account the film thickness distribution of the top layer film that is deposited on the top layer of the film to be polished and the bottom film that is in contact with the bottom surface of the film of the layer above it.

Figure 9:
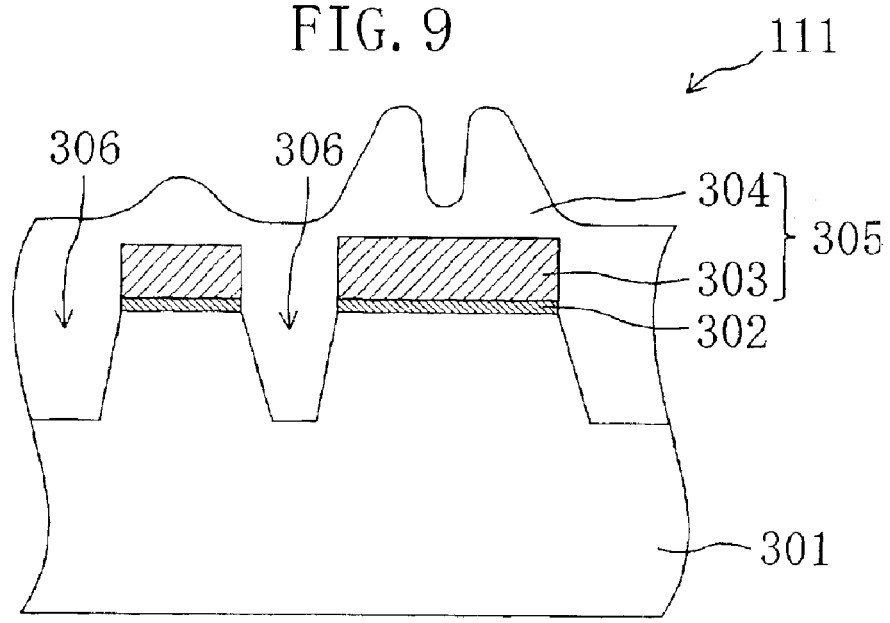
FIG. 9 is a cross-sectional view showing the structure of the semiconductor wafer that is polished in Embodiment 4.

As shown in FIG. 9, the wafer 111 that is polished in this embodiment is provided with a silicon substrate 301, a silicon oxide film 302 and a film to be polished 305, which is constituted by a bottom film 303 made of SiN and a top layer 304 made of NSG (non-doped silicate glass), sequentially deposited on the silicon substrate 301, and trenches 306 made by etching the bottom film 303, the silicon oxide film 302, and the silicon substrate 301. The top layer film 304 is filled in the trenches 306 by CVD.

Figure 10:
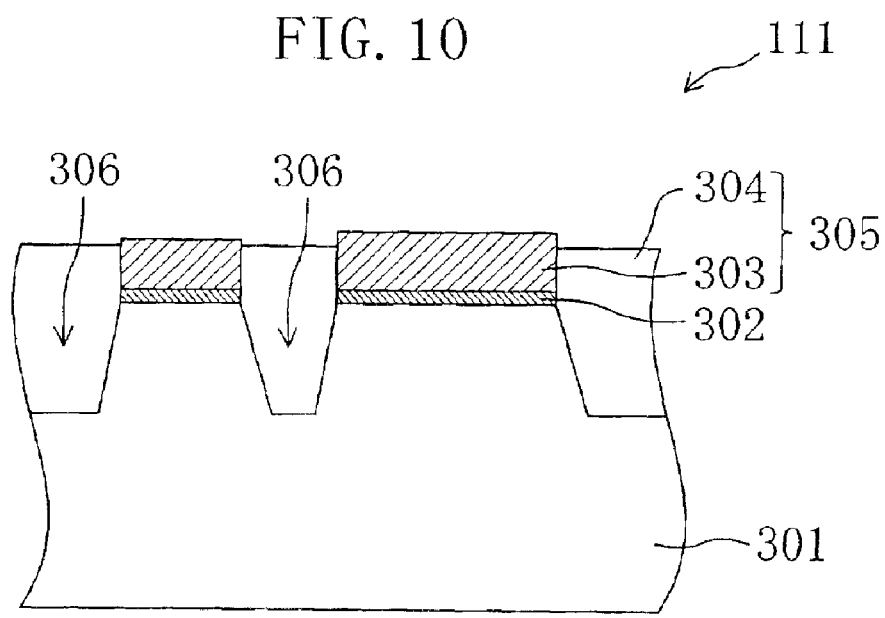
FIG. 10 is a cross-sectional view showing a planarized semiconductor wafer of Embodiment 4.
Figure 11:
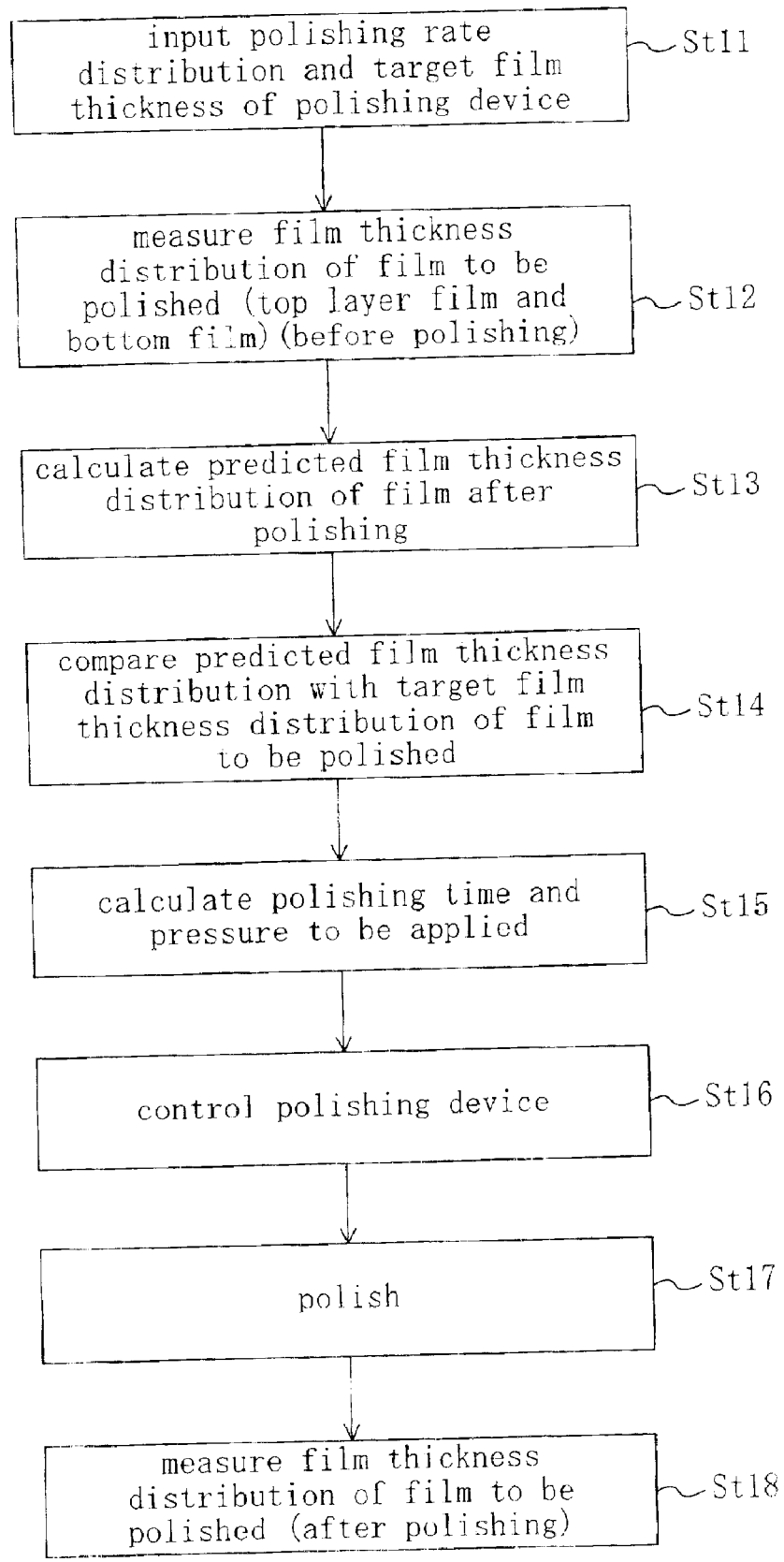
FIG. 11 is a flowchart showing the polishing method of Embodiment 4.

In this embodiment, the surface of the wafer 111 is planarized and an STI (shallow trench isolation) is formed by polishing the film to be polished 305, as shown in FIG. 10. Hereinafter, the polishing method of this embodiment is described with reference to FIGS. 1, 2, and 9 to 11. FIG. 9 is a cross-sectional view illustrating the structure of the semiconductor wafer that is polished in this embodiment. FIG. 10 is a cross-sectional view illustrating the planarized semiconductor wafer of this embodiment. FIG. 11 is a flowchart showing the polishing method of this embodiment.

First, as shown in FIG. 11, in step St11, the polishing rate distribution with respect to the top layer film 304 and the target film thickness distribution of the film to be polished 305, which are in the polishing device 10 are set in the computer 20. It should be noted that like in Embodiment 1, the initial data on the polishing rate distribution of the top layer film 304 and the initial data on the target film thickness distribution of the film to be polished 305 are set in the computer 20 in advance as data for system management, which is executed after system maintenance and after the system is started.

Next, in step St12, the film thickness distribution of the top layer film 304 and the bottom film 303 deposited on the wafer 111 (301) is measured using the optical film thickness measuring apparatus 30 and the results of this measurement are input to the computer 20, after which the wafer 111 is held by the carrier head 112. The film thickness distribution of the bottom film 303 also can be measured in advance immediately after the bottom film 303 is deposited during fabricating of the wafer 111.

Next, in step St13, the computer 20 calculates the predicted film thickness distribution after polishing the film 305, which is made of the top layer film 304 and the bottom film 303, from the measured film thickness distribution and the polishing rate distribution of the top layer film 304 and the bottom film 303. Here, if the films are polished by a silica slurry, the polishing rate ratio of the top layer film 304 made of NSG to the bottom film 303 made of SiN is 3:1. That is, the polishing rate of the top layer film 304 is three times as large that of the bottom film 303. In this embodiment, the top layer film 304 and the bottom film 303 are polished, and polishing is stopped when the surface of the wafer 111 has been planarized to the extent that the bottom film 303 is exposed. Thus, to achieve an even higher degree of planarization of the surface of the wafer 111, the effect of the bottom film 303 is taken into account. More specifically, the difference in the polishing rates of the top layer film 304 and the bottom film 303 is taken into account when calculating the predicted film thickness distribution after polishing the film 305. The method of calculating the predicted film thickness distribution after polishing the film 305 is described in greater detail later.

Figure 15:
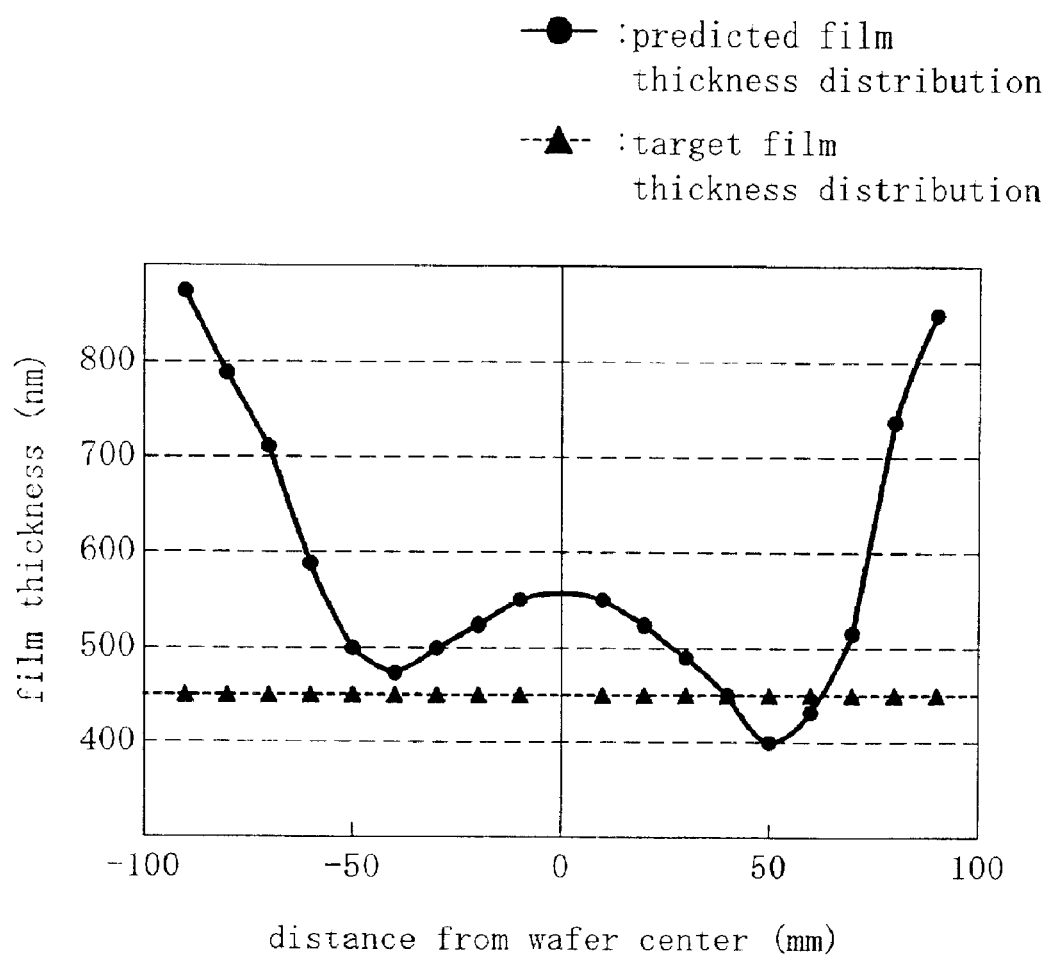
FIG. 15 is a diagram showing a comparison of the predicted film thickness distribution and the target film thickness distribution after polishing the film.

Next, in step St14, the computer 20 compares the predicted film thickness distribution with the target film thickness distribution after polishing of the polished film 305. As an example, results such as those shown in FIG. 15 are obtained. From FIG. 15, it is clear that the film thickness at the periphery portion of the wafer is larger in the predicted film thickness distribution than in the target film thickness distribution, in which the film thickness distribution is uniform over the entire wafer.

Next, in step St15, in order to achieve the target film thickness distribution of the film to be polished 305, the computer 20 calculates the ideal polishing time and the ideal pressure value for each region of the wafer 111 from the results of the comparison made in step St14.

Next, in step St16, the computer 20 controls each mass flow controller 118 provided in the carrier head 112 of the polishing device 10 so that the amount of gas flow corresponds to the pressure values that are calculated in step St15. For example, if results such as those shown in FIG. 15 are obtained in step St14, then it is clear that the predicted film thickness after polishing of the polished film 305 is thicker than the target film thickness distribution at the center and periphery portions of the wafer 111. Consequently, the amount of gas flow from the mass flow controllers 118 positioned at the center portion and the periphery portion of the wafer 111 is increased and controlled so that the polishing rate at the center portion and the periphery portion of the wafer 111 is raised.

Next, in step St17, the polishing device 10 polishes the wafer 111 at the optimal conditions (polishing time, pressure values at each region of the wafer) that are calculated in step St15.

Then, in step St18, the film thickness distribution of the film to be polished 304 is measured using the optical film thickness measuring apparatus 30, and the results of this measurement are input to the computer 20. When the results of this measurement are input to the computer 20, the computer 20 calculates a new polishing rate distribution for the polishing device 10 based on the difference between the film thickness distribution before polishing of the film to be polished 305 and the measured results.

Next, the procedure returns to step St11, and the computer 20 updates the established polishing rate distribution with the new polishing rate distribution.

By repeating the above steps St11 to St18, numerous wafers having polished films 305 with the target film thickness distribution can be obtained.

Detailed Description of Step St13

Next, the method of calculating the predicted film thickness distribution after polishing of the polished film 305 in step St13 is described with reference to FIGS. 12 to 15. It should be noted that the computer 20 performs the calculation of the predicted film thickness distribution after polishing of the film 305.

Figure 12:
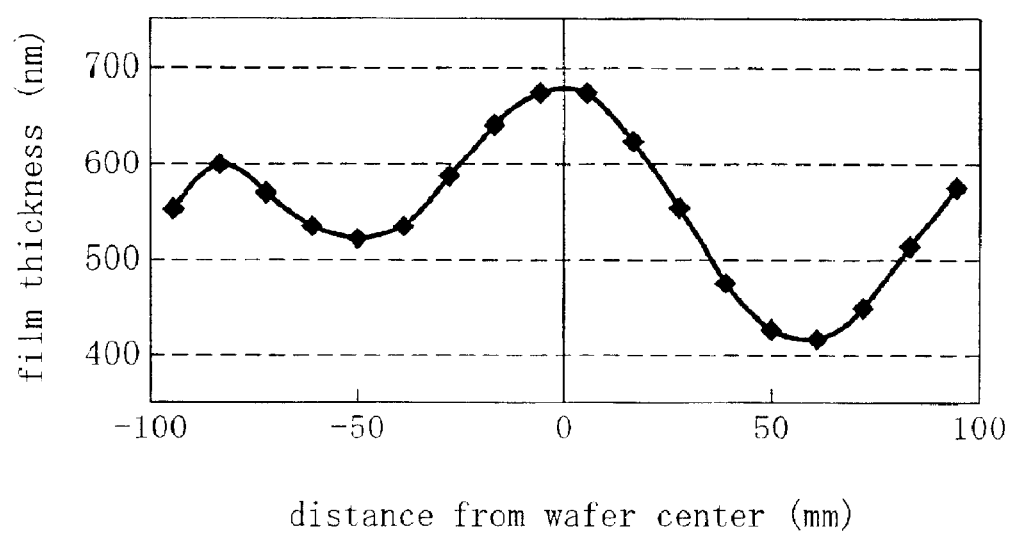
FIG. 12 is a profile representing the film thickness distribution before polishing of the top layer film that is deposited on the wafer.

FIG. 12 shows a profile of the film thickness distribution before polishing of the top layer film 304 made of NSG that is deposited on the wafer 111. As shown in FIG. 12, the top layer film 304 has a large film thickness at the periphery portion and the center portion of the wafer 111.

Figure 13:
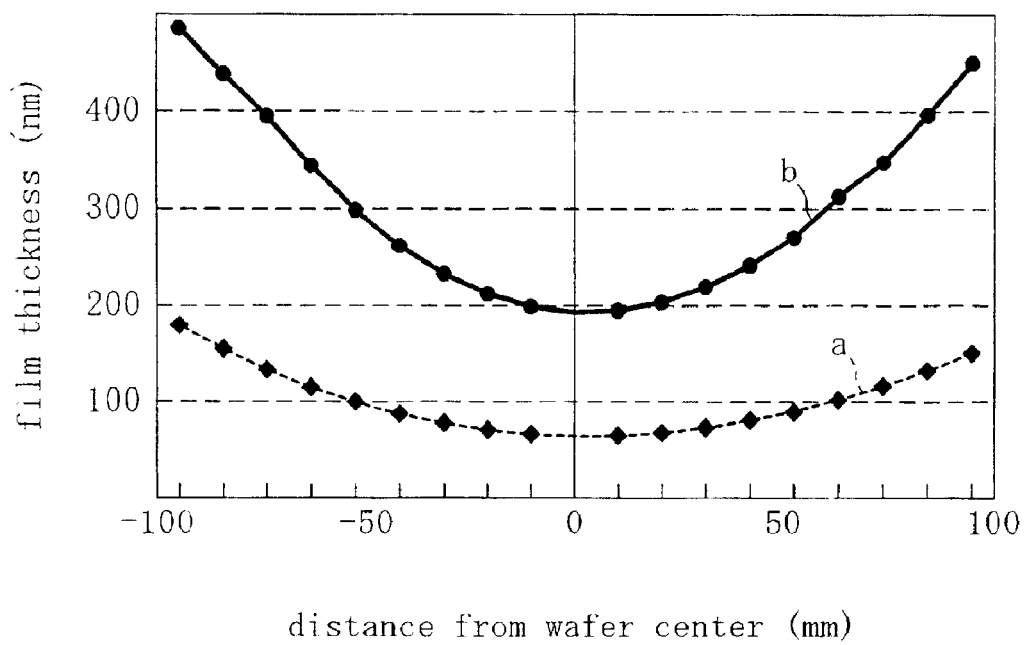
FIG. 13 is a profile representing the film thickness distribution before polishing of the bottom film.

FIG. 13 is a profile of the film thickness distribution before polishing of the bottom film 303 made of SiN. The dashed line a in FIG. 13 represents the film thickness distribution of the bottom film 303. The solid line b in FIG. 13 represents the film thickness distribution before polishing of the bottom film 303 that is converted to the film thickness distribution before polishing of the top layer film 304, based on the polishing rate ratio of the bottom film 303 to the top layer film 304.

More specifically, the following is performed in order to convert the film thickness distribution of the bottom film 303 to the film thickness distribution of the top layer film 304.

The polishing rate of the bottom film 303 made of SiN is one-third that of the top layer film 304 made of NSG. Thus, for example, a 90 nm thick bottom film 303 can be regarded as a 270 nm thick top layer film 304. The film thickness distribution of the bottom film 303 is likewise converted to the film thickness distribution of the top layer film 304. Consequently, the values of the points on the solid line b in FIG. 13 are three times the values of corresponding points on the dashed line a.

It should be noted that the polishing rate ratio of the bottom film 303 to the top layer film 304 has already been input to the computer 20 as data for system management, which is executed after system maintenance and after the system is started.

Figure 14:
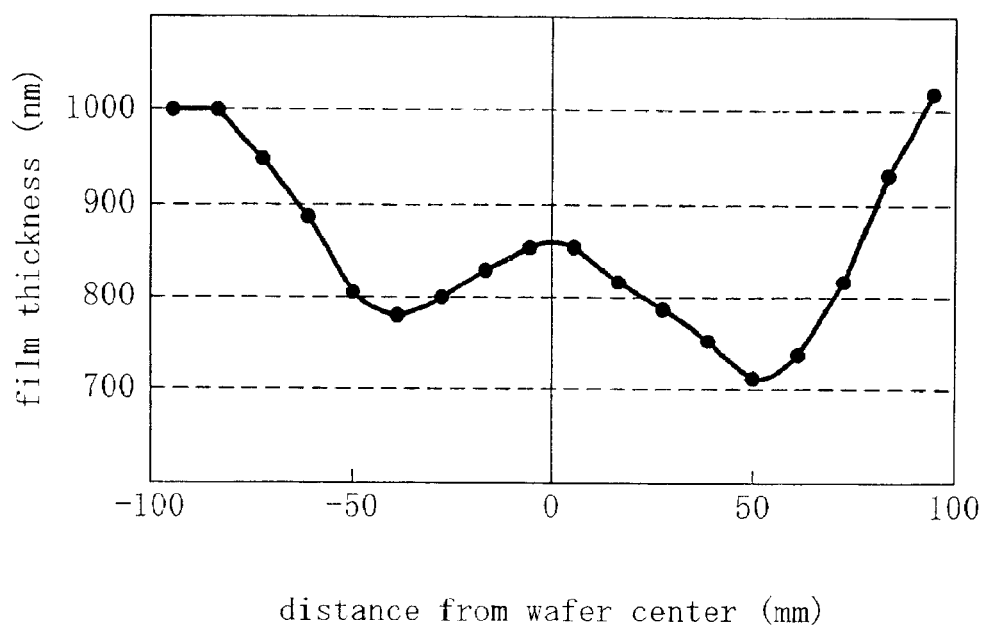
FIG. 14 is a diagram showing the film thickness distribution before polishing of the film to be polished.

Next, the profile of the film thickness distribution before polishing of the top layer film 304 shown in FIG. 12 and the profile of the solid line b shown in FIG. 13 are combined, and the results of this combination are shown in FIG. 14. The profile shown in FIG. 14 represents the film thickness distribution before polishing of the film to be polished 305 in a case where the film to be polished 305 is regarded as a film constituted by only the top layer film 304.

Next, the predicted film thickness distribution after polishing of the film to be polished 305 is calculated from the film thickness distribution of the film to be polished 305 shown in FIG. 14 and the polishing rate distribution with respect to the top layer film 304 in the polishing device 10. The results of this calculation are shown in FIG. 15.

In the polishing rate distribution with respect to the top layer film 304 that is in the polishing device 10, the polishing rate becomes progressively smaller toward the periphery portion of the wafer 111, so that as shown in FIG. 15, the film thickness at the periphery portion of the wafer 111 is large in the profile of the predicted film thickness distribution after polishing of the film to be polished 305.

If the bottom film 303 of the film to be polished 305 is also polished, then the impact of the bottom film 303 cannot be ignored if higher planarization of the surface of the wafer 111 is to be achieved. Thus, as mentioned above, the film thickness distribution and the polishing rate ratio of the bottom film 303 are taken into consideration, so that the film thickness distribution after polishing of the film to be polished 305 can be predicted with even greater accuracy.

Accordingly, the target film thickness distribution for the film to be polished 305 can be achieved with high accuracy. That is, according to this embodiment, a high degree of planarization of the surface of the wafer 111 can be achieved.

When the Bottom Film is not Polished

The foregoing description was made with regard to a case in which the bottom film 303 of the film to be polished 305 is also polished, however, a case in which only the top layer film 304 of the film to be polished 305 is polished and the bottom film 303 is not polished is also possible. In this case as well, the film thickness distribution of the bottom film 303 affects the unevenness of the surface of the top layer film 304. Consequently, achieving a high degree of planarization of the surface of the wafer 111 by polishing the film to be polished 305 requires consideration of the film thickness distribution of the bottom film 303.

A method of calculating the predicted film thickness distribution after polishing of the film to be polished 305 in step St13, in a case where only the top layer film 304 of the film to be polished 305 is polished and the bottom film 303 is not polished, is described below with reference to FIGS. 16 and 17.

Here, because the bottom film 303 is not polished, it is not necessary to give consideration to the polishing rate of the bottom film 303. Consequently, the profile of the film thickness distribution before polishing of the top layer film 304 shown in FIG. 12 and the profile of the film thickness distribution of the bottom film 303 shown by the dashed line a in FIG. 13 are combined. As a result, the film thickness distribution of the bottom film 303 can be converted to the film thickness distribution of the top layer film 304, and the results of this conversion are shown in FIG. 16. The profile that is shown in FIG. 16 represents the film thickness distribution before polishing of the film to be polished 305 if the film to be polished 305 is regarded as a film made of only the top layer film 304.

Figure 16:
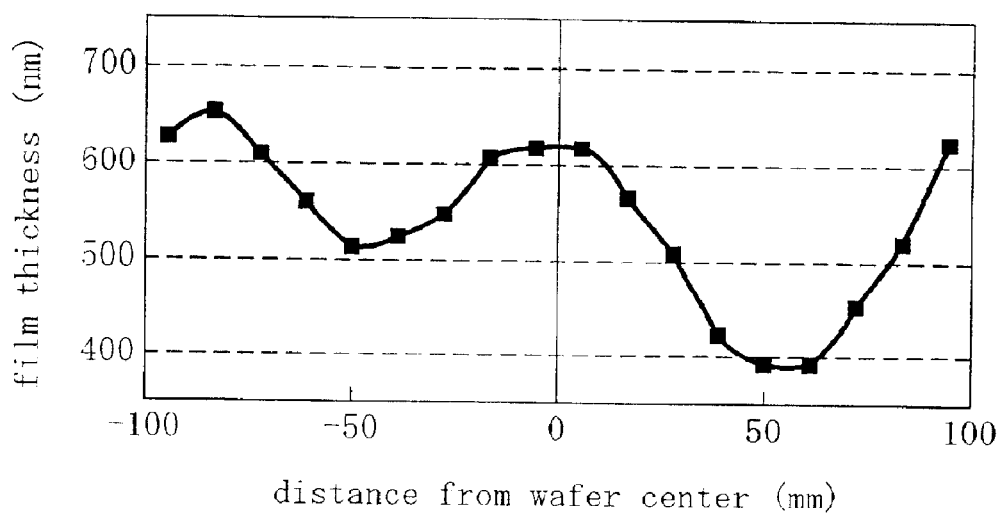
FIG. 16 is a diagram representing the film thickness distribution before polishing of the film to be polished.

Next, the predicted film thickness distribution after polishing of the film to be polished 305 is calculated from the film thickness distribution of the film to be polished 305 shown in FIG. 16 and the polishing rate distribution of the polishing device 10 with regard to the top layer film 304. The results of this calculation are shown in FIG. 17. It is clear from FIG. 17 that the film thickness at the periphery portion of the wafer is larger in the predicted film thickness distribution than in the target film thickness distribution, in which the film thickness distribution is uniform over the entire wafer.

Figure 17:
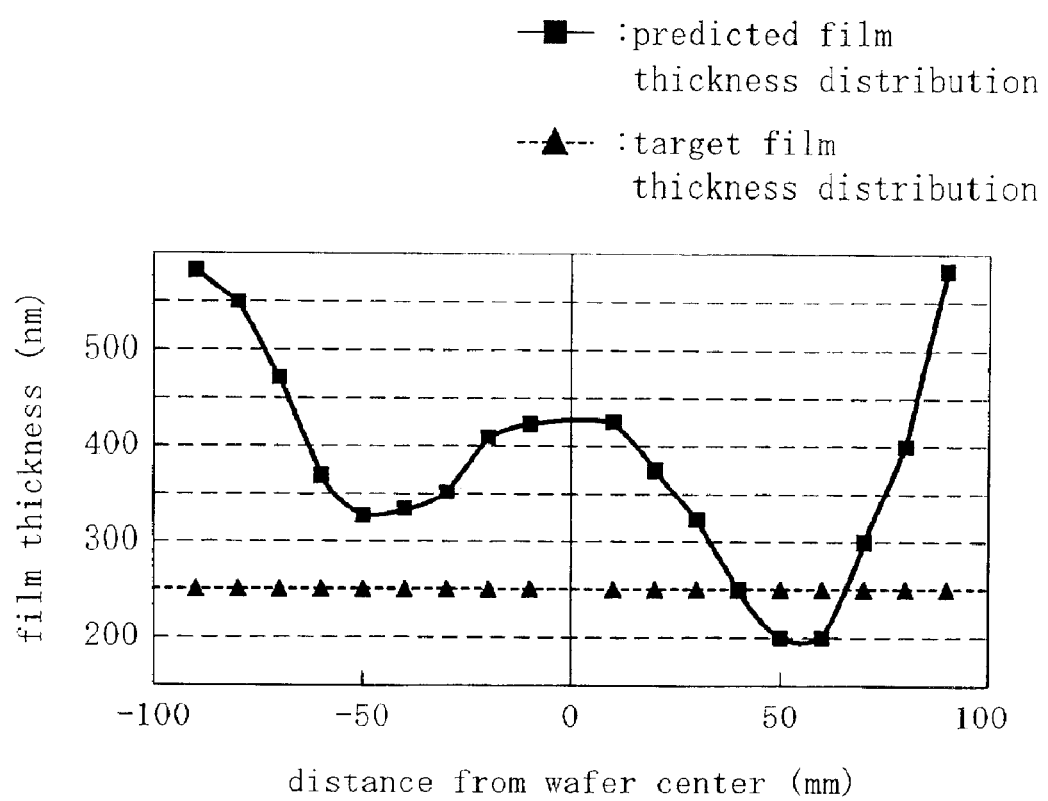
FIG. 17 is a diagram showing a comparison of the predicted film thickness distribution and the target film thickness distribution after polishing the film.

The polishing rate distribution of the polishing device 10 with respect to the top layer film 304 becomes progressively smaller toward the periphery portion of the wafer 111, so that as shown in FIG. 17, the film thickness at the periphery portion of the wafer 111 is large in the profile of the predicted film thickness distribution after polishing of the film to be polished 305.

As mentioned above, taking into account the film thickness distribution of the bottom film 303, the film thickness distribution after polishing of the film to be polished 305 can be predicted with a higher degree of accuracy. For that reason, the target film thickness distribution for the film to be polished 305 can be achieved with a high degree of accuracy. That is, according to this embodiment, a high degree of planarization of the surface of the wafer 111 is possible.

It should be noted that the film to be polished 305 was described as having a bottom film 303 and a top layer film 304, but this is not a limitation. In a case where the film to be polished is a stacked film made of a plurality of films, the film thickness distribution and the polishing rate of each film is taken into account, as in this embodiment, so that the film thickness distribution after polishing of the film to be polished can be predicted with a higher degree of accuracy.

Also, in the description of this embodiment, the polishing rate of the bottom film 303 was lower than that of the top layer film 304, but this is not a limitation. For example, this embodiment can also be suitably applied in a case where the polishing rate of the bottom film 303 is greater than that of the top layer film 304.

According to this embodiment, a high degree of planarization of a film to be polished that is deposited on a wafer can be can be achieved.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

Next, in step St16, the computer 20 controls each mass flow controller 118 provided in the carrier head 112 of the polishing device 10 so that the amount of gas flow corresponds to the pressure values that are calculated in step St15. For example, if results such as those shown in FIG. 15 are obtained in step St14, then it is clear that the predicted film thickness after polishing of the polished film 305 is thicker than the target film thickness distribution at the center and periphery portions of the wafer 111. Consequently, the amount of gas flow from the mass flow controllers 118 positioned at the center portion and the periphery portion of the wafer 111 is increased and controlled so that the polishing rate at the center portion and the periphery portion of the wafer 111 is raised.

What is claimed is:

1. A polishing method for planarizing a film to be polished that is deposited on a wafer, comprising:

a step (a) of establishing a polishing rate distribution of the film to be polished that is deposited on the wafer and a target film thickness distribution after polishing of the film to be polished;

a step (b) of measuring a film thickness distribution before polishing of the film to be polished;

a step (c) of calculating a predicted film thickness distribution after polishing of the film from the film thickness distribution before polishing and the polishing rate distribution;

a step (d) of calculating a polishing time and a pressure against a polishing pad for each of a plurality of regions of the film to be polished, from the predicted film thickness distribution and the target film thickness distribution; and a step (e) of polishing while applying the pressure against the film to be polished during the polishing time;

wherein the film to be polished has a top layer film located at an uppermost portion and a bottom layer film formed below the top layer film;

in the step (a), a polishing rate distribution of the top layer film and a target film thickness distribution after polishing of the film to be polished are established;

in the step (b), the film thickness distribution before polishing of the top layer film and the bottom layer film are measured; and in the step (c), the predicted film thickness distribution after polishing of the film to be polished is calculated from a film thickness distribution before polishing of the film to be polished, which has been converted based on a polishing rate ratio of the bottom layer film to the top layer film, and the polishing rate distribution of the top layer film.

2. The polishing method according to claim 1, further comprising a step (f), carried out after the step (e), of measuring the film thickness distribution after polishing the film and updating the polishing rate distribution based on the film thickness distribution after polishing and the film thickness distribution before polishing, wherein the steps (a) to (e) are repeated.

3. The polishing method according to claim 2, wherein a test wafer is used when the step (a) is carried out for a first time.

4. A polishing method for planarizing a film to be polished that is deposited on a wafer, said method comprising: a step (a) of establishing a polishing rate distribution of the film to be polished that is deposited on the wafer and a target film thickness distribution after polishing of the film to be polished;

a step (b) of measuring a film thickness distribution before polishing of the film to be polished;

a step (c) of calculating a predicted film thickness distribution after polishing of the film from the film thickness distribution before polishing and the polishing rate distribution;

a step (d) of calculating a polishing time and a pressure against a polishing pad for each of a plurality of regions of the film to be polished, from the predicted film thickness distribution and the target film thickness distribution; and a step (e) of polishing while applying the pressure against the film to be polished during the polishing time, wherein the film to be polished has a top layer film located at an uppermost portion and a bottom layer film formed below the top layer film;

in the step (a), a polishing rate distribution of the top layer film and a target film thickness distribution after polishing of the film to be polished are established;

in the step (b), the film thickness distribution before polishing of the top layer film and the bottom layer film are measured; and in the step (c), the predicted film thickness distribution after polishing of the film to be polished is calculated from the polishing rate distribution of the top layer film and the film thickness distribution before polishing of the film to be polished, which is obtained from the film thickness distribution before polishing of the top layer film and the bottom layer film.

5. The polishing method according to claim 4, further comprising a step (f), carried out after the step (e), of measuring the film thickness distribution after polishing the film and updating the polishing rate distribution based on the film thickness distribution after polishing and the film thickness distribution before polishing, wherein the steps (a) to (e) are repeated.

6. The polishing method according to claim 5, wherein a test wafer is used when the step (a) is carried out for a first time.

* * * * *